United States Patent
Nagano et al.

(10) Patent No.: US 6,756,282 B2
(45) Date of Patent: Jun. 29, 2004

(54) SEMICONDUCTOR DEVICE AND METHOD OF FABRICATING THE SAME

(75) Inventors: Yoshihisa Nagano, Suita (JP); Yasuhiro Uemoto, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 74 days.

(21) Appl. No.: 10/164,409

(22) Filed: Jun. 10, 2002

(65) Prior Publication Data

US 2002/0149045 A1 Oct. 17, 2002

Related U.S. Application Data

(62) Division of application No. 09/576,971, filed on May 24, 2000.

(30) Foreign Application Priority Data

May 26, 1999 (JP) .............................. 11-146103

(51) Int. Cl.$^7$ ............................................. H01L 21/20
(52) U.S. Cl. ..................... 438/396; 438/240; 438/387; 438/393; 438/381; 361/303; 361/311; 361/321.3; 257/306; 257/310; 257/334
(58) Field of Search ............................. 438/240, 381, 438/387, 393, 396; 361/303, 311, 321.3; 257/310, 306, 334

(56) References Cited

U.S. PATENT DOCUMENTS

| 5,284,799 A | 2/1994 | Sato |
| 5,335,138 A | 8/1994 | Sandhu et al. |
| 5,371,700 A | 12/1994 | Hamada |
| 5,414,655 A | 5/1995 | Ozaki et al. |
| 5,644,151 A | 7/1997 | Izumi et al. |
| 5,672,533 A * | 9/1997 | Arima et al. .................. 437/52 |
| 5,789,303 A | 8/1998 | Leung et al. |
| 5,880,991 A | 3/1999 | Hsu et al. |
| 6,509,601 B1 * | 1/2003 | Lee et al. .................... 257/310 |

FOREIGN PATENT DOCUMENTS

JP  11-008355  1/1999

* cited by examiner

Primary Examiner—David Nelms
Assistant Examiner—Renee Berry
(74) Attorney, Agent, or Firm—Nixon Peabody LLP; Donald R. Studebaker

(57) ABSTRACT

A protective insulating film is deposited over first and second field-effect transistors formed on a semiconductor substrate. A capacitor composed of a capacitor lower electrode, a capacitor insulating film composed of an insulating metal oxide film, and a capacitor upper electrode is formed on the protective insulating film. A first contact plug formed in the protective insulating film provides a direct connection between the capacitor lower electrode and an impurity diffusion layer of the first field-effect transistor. A second contact plug formed in the protective insulating film provides a direct connection between the capacitor upper electrode and an impurity diffusion layer of the second field-effect transistor.

5 Claims, 11 Drawing Sheets

SEMICONDUCTOR DEVICE AND METHOD OF FABRICATING THE SAME

BACKGROUND OF THE INVENTION

The present invention relates to a semiconductor device comprising a capacitor having a capacitor insulating film composed of an insulating metal oxide film such as a ferroelectric film or a high-dielectric-constant film and to a method of fabricating the same.

With the advancement of digital technology in recent years, there have been increasing tendencies to process or store a larger amount of data. Under such circumstances, electronic equipment has been more sophisticated than ever, which has rapidly increased the integration density of a semiconductor integrated circuit used in the electronic equipment and promoted the miniaturization a semiconductor element used therein.

To increase the integration density of a dynamic RAM composing the semiconductor integrated circuit, research and development has been conducted widely on a technique using a ferroelectric film or a high-dielectric-constant film as a capacitor insulating film in place of a silicon oxide film or a silicon nitride film that has been used conventionally.

To implement an actually usable nonvolatile RAM which operates at a low voltage and permits a high-speed write or read operation performed thereto, vigorous research and development has been conducted on a ferroelectric film having the property of spontaneous polarization.

The most significant challenge to the implementation of a semiconductor device comprising a capacitor having a capacitor insulating film made of an insulating metal oxide such as a ferroelectric film or a high-dielectric-constant film is the development of a process which allows the integration of the capacitor into a CMOS integrated circuit without degrading the properties of the capacitor. In particular, the most important point is to prevent the degradation of the properties of the capacitor due to the reduction of an insulating metal oxide composing the capacitor insulating film by hydrogen.

Referring now to FIG. 8, a conventional semiconductor device comprising a capacitor insulating film made of an insulating metal oxide and a fabrication method therefor will be described.

As shown in FIG. 8, a device isolation region 11 is formed in a surface portion of a semiconductor substrate 10, followed by a gate electrode 13 formed on the semiconductor substrate 10 with a gate insulating film 12 interposed therebetween. Then, impurity ions at a low concentration are implanted by using the gate electrode 13 as a mask. Subsequently, impurity ions at a high concentration are implanted by using the gate electrode 13 and the gate protective insulating film 14 as a mask, whereby impurity diffusion layers 15 each having an LDD structure and serving as a source or drain region of the field-effect transistor is formed.

Next, a first protective insulating film 16 is deposited over the entire surface of the semiconductor substrate 10. Then, a first contact hole is formed in the first protective insulating film 16 and a conductive film is filled in the first contact hole, whereby a first contact plug 17 connected to one of the impurity diffusion layers 15 which serves as the source or drain region of the first field-effect transistor forming a memory cell is formed.

Next, a capacitor lower electrode 18 composed of a multilayer film consisting of a titanium film, a titanium nitride film, an iridium oxide film, and a platinum film and connected to the first contact plug 17 and a capacitor insulating film 19 composed of an insulating metal oxide are formed on the first protective insulating film 16. Thereafter, an insulating film 20 is formed on the first protective insulating film 16 to be located between the capacitor lower electrode 18 and the capacitor insulating film 19.

Next, a capacitor upper electrode 21 composed of a multilayer film consisting of a platinum film and a titanium film is formed over the plurality of capacitor insulating films 19 and the insulating film 20 to have a peripheral portion extending over the first protective insulating film 16. The foregoing capacitor lower electrode 18, the capacitor insulating film 19, and the capacitor upper electrode 21 constitute a capacitor for storing data. The capacitor and the first field-effect transistor constitute a memory cell. A plurality of memory cells constitute a memory cell array.

Next, a hydrogen barrier film 22 composed of a silicon nitride film or a boron nitride film is formed to cover the capacitor upper electrode 21. Then, a second protective insulating film 23 is deposited entirely over the hydrogen barrier film 22 and the first protective insulating film 16. The hydrogen barrier layer 22 has the function of preventing a hydrogen atom from being diffused in the capacitor upper electrode 21, reaching the capacitor insulating film 19, and reducing the insulating metal oxide composing the capacitor insulating film 19.

Next, a second contact hole 27 (see FIG. 9(a)) is formed in the second protective insulating film 23 and then a third contact hole 28 (see FIG. 9(b)) is formed in the first and second protective insulating films 16 and 23. Subsequently, a conductive film is deposited on the second protective insulating film 23 such that the second and third contact holes 27 and 28 are filled therewith and then patterned, thereby forming a second contact plug 24 connected to the capacitor upper electrode 21, a third contact plug 25 connected to the impurity diffusion layer 15 of the second field-effect transistor forming a sense amp, and a wiring layer 26 for providing a connection between the second and third contact plugs 24 and 25.

In a semiconductor memory comprising a capacitor for storing data which has the capacitor insulating film 19 made of an insulating metal oxide, a voltage is applied to the capacitor lower electrode 18 for every one bit so that the capacitor lower electrode 18 is connected to the impurity diffusion layer 15 of the first field-effect transistor via the first contact plug 17. On the other hand, since a voltage is applied to the capacitor upper electrode 21 for every plural bits, the capacitor upper electrode 21 is connected to the impurity diffusion layer 15 of the second field-effect transistor forming a sense amp via the second contact plug 24, the wiring layer 26, and the third contact plug 25.

In the process of inspecting the properties of the capacitor of the semiconductor device obtained by the method described above, the present inventors noticed that the insulating metal oxide composing the capacitor insulating film 19 was reduced irrespective of the hydrogen barrier film 22 provided on the capacitor upper electrode 21 with the view to preventing the reduction of the insulating metal oxide and the properties of the capacitor were degraded thereby.

As a result of making a wide variety of examinations on the cause of the reduction of the insulating metal oxide, the present inventors found that the insulating metal oxide was reduced in accordance with the following mechanism. A description will be given to the mechanism whereby the insulating metal oxide film is reduced irrespective of the hydrogen barrier film 22 provided on the capacitor upper electrode 21.

In the step of forming the second contact hole 27 in the second protective insulating film 23 by using the first resist pattern 29 and removing the first resist pattern 29 by using an oxygen plasma, as shown in FIG. 9(a), and in the step of forming the third contact hole 28 in the first and second protective insulating films 16 and 23 by using the second resist pattern 30 and removing the second resist pattern 30 by using an oxygen plasma, as shown in FIG. 9(b), the capacitor upper electrode 21 is exposed in the second contact hole 27 via the opening formed in the hydrogen barrier film 22, as shown in FIG. 10(a). Although FIG. 10(a) shows the state in which the second resist pattern 30 is formed on the second protective insulating film 23, the capacitor upper electrode 21 is also opposed to the first resist pattern 29 via the opening formed in the hydrogen barrier film 22 even if the second contact hole 27 is formed in the second protective insulating film 23 by using the first resist pattern 29.

As a result, most of OH groups generated in removing the first and second resist patterns 29 and 30 by using the oxygen plasma are evaporated but some of the generated OH groups are decomposed by the catalytic reaction of platinum present on a surface of the capacitor upper electrode 21, so that active hydrogen is generated on the surface of the capacitor upper electrode 21 as shown in FIG. 10(b). Oxygen generated through the decomposition of the OH group is combined with carbon in the resist pattern to form CO, which is evaporated. The active hydrogen generated on the surface of the capacitor upper electrode 21 is diffused in the capacitor upper electrode 21 through the opening of the hydrogen barrier film 22 of the capacitor upper electrode 22 to reach the capacitor insulating film 19 and reduce the insulating metal oxide composing the capacitor insulating film 19, as shown in FIG. 10(c), which degrades the properties of the capacitor.

If the wiring layer 26 formed by patterning the conductive film deposited on the second protective insulating film 23 is subjected to an annealing process (sintering) performed in a hydrogen atmosphere, a hydrogen atom is diffused in the second contact plug 24 and in the capacitor upper electrode 21 to reach the capacitor insulating film 19 and reduce the insulating metal oxide composing the capacitor insulating film 19, as shown in FIG. 11, which also degrades the properties of the capacitor.

SUMMARY OF THE INVENTION

In view of the foregoing, it is therefore an object of the present invention to prevent the reduction of an insulating metal oxide composing a capacitor insulating film and thereby prevent the degradation of the properties of the capacitor.

To attain the object, a semiconductor device according to the present invention comprises: a protective insulating film deposited on a semiconductor substrate having first and second field-effect transistors formed thereon; a capacitor composed of a capacitor lower electrode, a capacitor insulating film made of an insulating metal oxide, and a capacitor upper electrode which are formed in upwardly stacked relationship on the protective insulating film; a first contact plug formed in the protective insulating film to provide a direct connection between an impurity diffusion layer serving as a source or drain region of the first field-effect transistor and the capacitor lower electrode; and a second contact plug formed in the protective insulating film to provide a direct connection between an impurity diffusion layer serving as a source or drain region of the second field-effect transistor and the capacitor upper electrode.

In the semiconductor device according to the present invention, the capacitor upper electrode of the capacitor is connected directly to the impurity diffusion layer of the second field-effect transistor by the second contact plug formed in the protective insulating film, not by the wiring layer formed on the protective insulating film deposited on the capacitor as in the conventional semiconductor device. This obviates the necessity to form a contact hole for providing a connection between the wiring layer formed on the protective insulating film on the capacitor and the capacitor upper electrode and hence the necessity for a resist pattern for forming the contact hole. As a result, there can be circumvented a situation in which hydrogen generated in removing the resist pattern by using an oxygen plasma reaches the capacitor insulating film. Since the capacitor upper electrode is covered with the protective insulating film on the capacitor during the formation of the contact hole for providing a connection between the wiring layer formed on the protective insulating film on the capacitor and the impurity diffusion layer of the second field-effect transistor, there can be circumvented a situation in which hydrogen generated in removing the resist pattern for forming the contact hole by using an oxygen plasma reaches the capacitor insulating film. Even if the wiring layer formed on the protective insulating film on the capacitor is treated with heat in a hydrogen atmosphere, hydrogen in the hydrogen atmosphere is prevented from reaching the capacitor insulating film since the wiring layer is not connected to the capacitor upper electrode. This prevents the reduction of the insulating metal oxide composing the capacitor insulating film and improves the properties of the capacitor.

In the semiconductor device according to the present invention, the capacitor insulating film is preferably formed conformally to the capacitor lower electrode, the semiconductor device preferably further comprising: insulating sidewalls formed on respective side surfaces of the capacitor lower electrode and the capacitor insulating film, wherein the capacitor upper electrode is preferably formed over the capacitor insulating film and the sidewalls.

In the arrangement, it is sufficient for the insulating metal oxide film serving as the capacitor insulating film to be formed excellently over an upper portion of the capacitor lower electrode having a flat configuration, so that the insulating metal oxide film is formed easily.

In this case, the sidewalls are preferably made of silicon oxide.

In the semiconductor device according to the present invention, the capacitor lower electrode preferably includes a plurality of capacitor lower electrodes formed on the protective insulating film, the semiconductor device preferably further comprising: an insulating film formed between the plurality of capacitor lower electrodes, wherein the capacitor insulating film is preferably formed over the plurality of capacitor lower electrodes and the insulating film.

In the arrangement, the insulating metal oxide film serving as the capacitor insulating film is formed over the plurality of capacitor lower electrodes and the insulating film having a flat configuration, so that the insulating metal oxide film is formed easily.

In this case, the insulating film is preferably composed of silicon oxide.

The semiconductor device according to the present invention preferably further comprises: a hydrogen barrier film entirely covering the capacitor upper electrode.

The arrangement positively prevents a situation in which a hydrogen atom is diffused in the capacitor upper electrode to reach the capacitor insulating film and reduce the insulating metal oxide film composing the capacitor insulating film.

In the semiconductor device according to the present invention, each of the first and second contact plugs is preferably made of polysilicon or tungsten.

In the semiconductor device according to the present invention, the capacitor insulating film is preferably made of a ferroelectric material having a bismuth layered perovskite structure, lead zirconate titanate (PZT), barium strontium titanate, or tantalum pentaoxide.

A method of fabricating a semiconductor device according to the present invention comprises the steps of: depositing a protective insulating film on a semiconductor substrate having first and second field-effect transistors formed thereon; forming a first contact plug and a second contact plug in the protective insulating film, the first contact plug being connected to an impurity diffusion layer serving as a source or drain region of the first field-effect transistor, the second contact plug being connected to an impurity diffusion layer serving as a source or drain region of the second field-effect transistor; forming, on the protective insulating film, a capacitor lower electrode connected directly to the first contact plug; forming, on the capacitor lower electrode, a capacitor insulating film made of an insulating metal oxide; and forming, on the capacitor insulating film, a capacitor upper electrode having a peripheral portion located on the protective insulating film and connected directly to the second contact plug.

In the method of fabricating a semiconductor device according to the present invention, the capacitor upper electrode of the capacitor is connected directly to the impurity diffusion layer of the second field-effect transistor by the second contact plug formed in the protective insulating film, not by the wiring layer formed on the protective insulating film deposited on the capacitor as in the conventional semiconductor device. This obviates the necessity to form a contact hole for providing a connection between the wiring layer formed on the protective insulating film on the capacitor and the capacitor upper electrode and therefore the necessity for a resist pattern for forming the contact hole. As a result, there can be circumvented a situation in which hydrogen generated in removing the resist pattern by using an oxygen plasma reaches the capacitor insulating film. Since the capacitor upper electrode is covered with the protective insulating film on the capacitor during the formation of the contact hole for providing a connection between the wiring layer formed on the protective insulating film on the capacitor and the impurity diffusion layer of the second field-effect transistor, there can be circumvented a situation in which hydrogen generated in removing the resist pattern for forming the contact hole by using an oxygen plasma reaches the capacitor insulating film. Even if the wiring layer formed on the protective insulating film on the capacitor is treated with heat in a hydrogen atmosphere, hydrogen in the hydrogen atmosphere is prevented from reaching the capacitor insulating film since the wiring layer is not connected to the capacitor upper electrode. This prevents the reduction of the insulating metal oxide composing the capacitor insulating film and improves the properties of the capacitor.

The method of fabricating a semiconductor device according to the present invention preferably further comprises the step of: forming a hydrogen barrier film covering the capacitor upper electrode.

The arrangement positively prevents a situation in which a hydrogen atom is diffused in the capacitor upper electrode to reach the capacitor insulating film and reduce the insulating metal oxide composing the capacitor insulating film.

In the method of fabricating a semiconductor device according to the present invention, the step of forming the capacitor insulating film preferably includes the step of forming a capacitor insulating film which is conformal to the capacitor lower electrode, the method preferably further comprising, between the step of forming the capacitor insulating film and the step of forming the capacitor upper electrode, the step of: forming insulating sidewalls on respective side surfaces of the capacitor lower electrode and the capacitor insulating film, wherein the step of forming the capacitor upper electrode preferably includes the step of forming the capacitor upper electrode over the capacitor insulating film and the sidewalls.

In the arrangement, it is sufficient for the insulating metal oxide film serving as the capacitor insulating film to be formed excellently over an upper portion of the capacitor lower electrode having a flat configuration, so that the insulating metal oxide film is formed easily.

In the method of fabricating a semiconductor device according to the present invention, the step of forming the capacitor lower electrode preferably includes the step of forming a plurality of capacitor lower electrodes on the protective insulating film, the method preferably further comprising, between the step of forming the capacitor lower electrode and the step of forming the capacitor insulating film, the step of: forming an insulating film between the plurality of capacitor lower electrodes, wherein the step of forming the capacitor insulating film preferably includes the step of forming the capacitor insulating film over the plurality of capacitor lower electrodes and the insulating film.

In the arrangement, the insulating metal oxide film serving as the capacitor insulating film is formed over the plurality of capacitor lower electrodes and the insulating film having a flat configuration, so that the insulating metal oxide film is formed easily.

DETAILED DESCRIPTION OF THE INVENTION

Embodiment 1

A semiconductor device according to a first embodiment of the present invention will be described with reference to FIG. 1.

Figure 1:
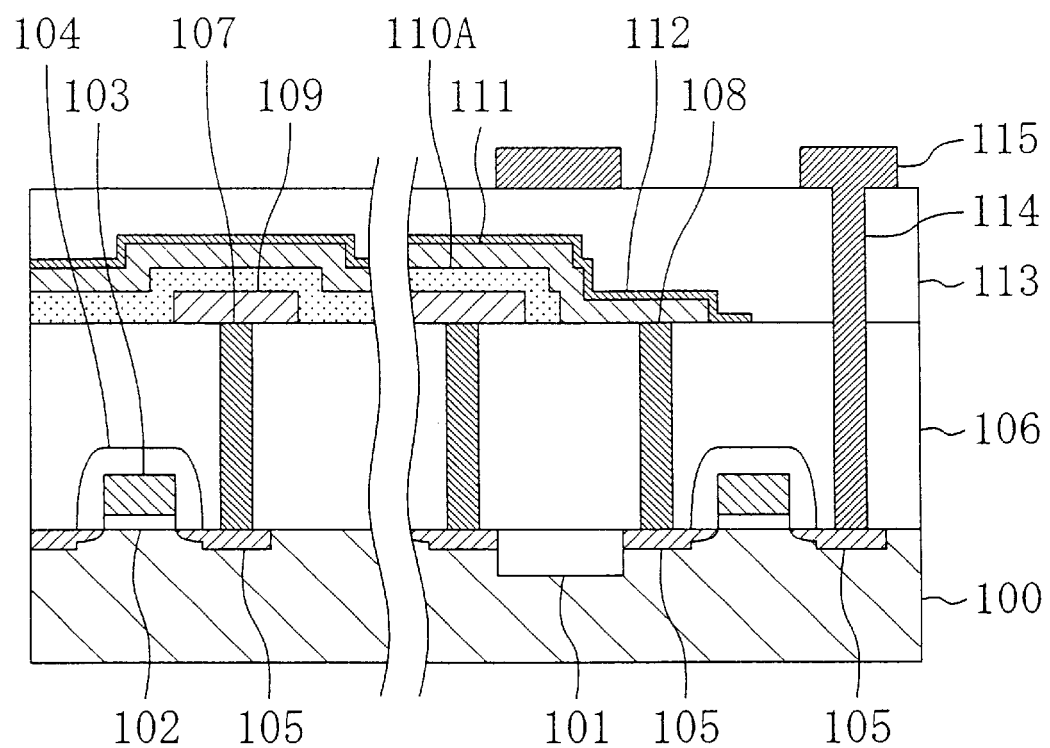
FIG. 1 is a cross-sectional view of a semiconductor device according to a first embodiment of the present invention.

As shown in FIG. 1, a device isolation region 101 and impurity diffusion layers 105 each serving as the source or drain region of a first field-effect transistor or the source or drain region of the second field-effect transistor are formed in a surface portion of a semiconductor substrate 100. A gate electrode 103 is formed on the semiconductor substrate 100 to be located between the pair of impurity diffusion layers 105 with a gate insulating film 102 interposed therebetween. The top and side surfaces of the gate electrode 103 are covered with a gate protective insulating film 104.

A first protective insulating film 106 is deposited over the gate protective insulating film 104 and the semiconductor substrate 100. In the first protective insulating film 106, there are formed first and second contact plugs 107 and 108 each composed of a tungsten or polysilicon film. The first contact plug 107 is connected to one of the impurity diffusion layers 105 which serves as the source or drain region of the first field-effect transistor forming a memory cell and a second contact plug 108 is connected to one of the impurity diffusion layers 105 which serves as the source or drain region of the second field-effect transistor forming a sense amp.

A plurality of capacitor lower electrodes 109 each composed of a multilayer film consisting of a titanium film, a titanium nitride film, an iridium oxide film, and a platinum film and connected to the first contact plug 107 are formed on the first protective insulating film 106. A capacitor insulating film 110A made of $SrBi_2(Ta_{1-x}Nb_x)O_9$ having a bismuth layered perovskite structure is formed over the plurality of capacitor lower electrodes 109 to extend to the exterior thereof.

A capacitor upper electrode 111 composed of a multilayer film consisting of a platinum film and a titanium film or a titanium nitride film and connected to the second contact plug 108 is formed on the capacitor insulating film 110A. The capacitor upper electrode 111 is covered with a hydrogen barrier film 112 composed of a silicon nitride film or a boron nitride film.

The foregoing capacitor lower electrode 109, the capacitor insulating film 110A, and the capacitor upper electrode 111 constitute a capacitor for storing data. The capacitor and the first field-effect transistor constitute a memory cell. A plurality of memory cells constitute a memory array.

A second protective insulating film 113 is deposited on the first protective insulating film 106. A third contact plug 114 connected to the other of the impurity diffusion layers 105 serving as the source or drain region of the second field-effect transistor is formed in the first and second protective insulating films 106 and 113. A wiring layer 115 connected to the third contact plug 114 is formed on the second protective insulating film 113. Each of the third contact plug 114 and the wiring layer 115 is composed of a multilayer film consisting of a titanium film, a titanium nitride film, an aluminum film, and a titanium nitride film which are deposited in upwardly stacked relationship or a multilayer film consisting of a titanium film, a titanium nitride film, a tungsten film, a titanium film, a titanium nitride film, an aluminum film, and a titanium nitride film which are deposited in upwardly stacked relationship.

Figure 2A:
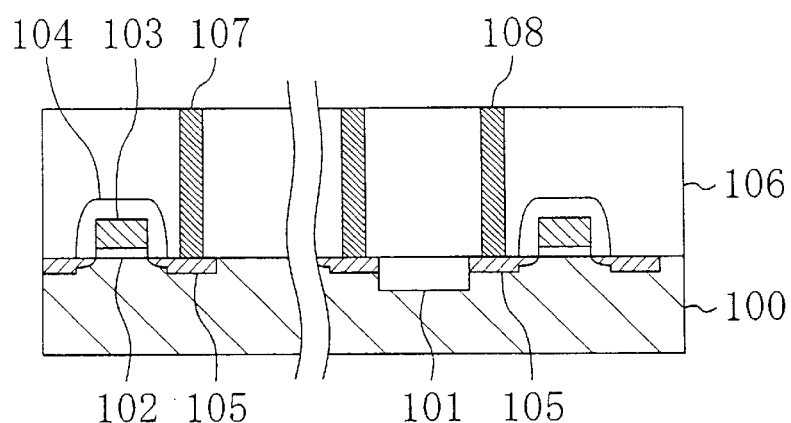
FIGS. 2(a) and (b) are cross-sectional views illustrating a method of fabricating the semiconductor device according to the first embodiment.

Referring to FIGS. 2(a) and (b) and FIGS. 3(a) and (b), a description will be given to a method of fabricating the semiconductor device according to the first embodiment.

First, as shown in FIG. 2(a), the device isolation region 101 is formed in the surface portion of the semiconductor substrate 100, followed by the gate electrode 103 formed on the semiconductor substrate 100 with the gate insulating film 102 interposed therebetween. Then, impurity ions at a low concentration are implanted by using the gate electrode 103 as a mask and the gate protective oxide insulating film 104 is formed on the top and side surfaces of the gate electrode 103. Subsequently, impurity ions at a high concentration are implanted by using the gate electrode 103 and the gate protective insulating film 104 as a mask, whereby the impurity diffusion layers 105 each having an LDD structure and serving as the source or drain region of the first field-effect transistor or the source or drain region of the second field-effect transistor are formed.

Next, the first protective insulating film 106 is deposited over the entire surface of the semiconductor substrate 100 and a contact hole is formed by dry etching in the first protective insulating film 106. Then, a conductive film composed of a tungsten film or a polysilicon film is deposited by CVD over the entire surface of the first protective insulating film 106. Subsequently, the portion of the conductive film located over the first protective insulating film 106 is removed by an etch-back or CMP process, whereby the first contact plug 107 connected to one of the impurity diffusion layers 105 which serves as the source or drain region of the first field-effect transistor forming the memory cell is formed and the second contact plug 108 connected to one of the impurity diffusion layers 105 which serves as the source or drain region of the second field-effect transistor disposed in the peripheral portion of the memory cell array to form a sense amp is formed.

Figure 2B:
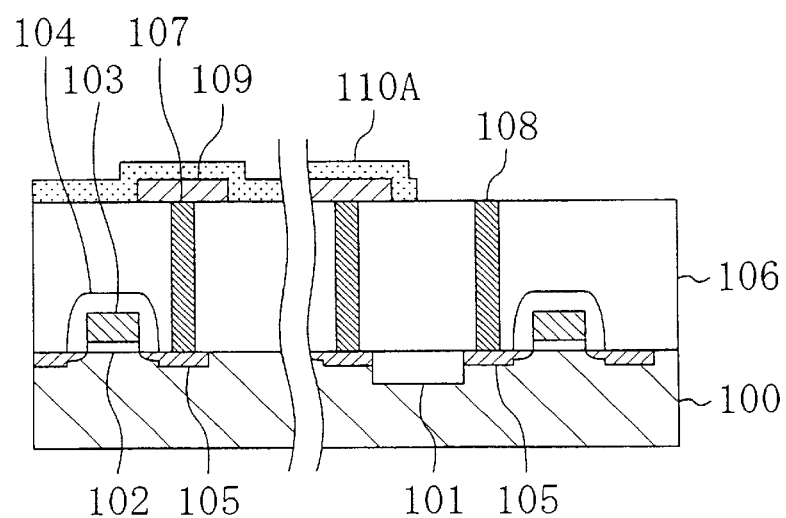

Next, the multilayer film consisting of the titanium film, the titanium nitride film, the iridium oxide film, and the platinum film which are deposited in upwardly stacked relationship is formed over the entire surface of the first protective insulating film 106 and then patterned by dry etching, thereby forming the capacitor lower electrode 109 connected to the first contact plug 107, as shown in FIG. 2(b).

Next, a ferroelectric film made of $SrBi_2(Ta_{1-x}Nb_x)O_9$ having a bismuth layered perovskite structure and having a thickness of about 100 nm to 200 nm is deposited entirely over the capacitor lower electrodes 109 and the first protective insulating film 106 by metal organic decomposition (MOD), metal organic chemical vapor deposition (MOCVD), or sputtering and then patterned, thereby forming the capacitor insulating film 110A extending over the plurality of capacitor lower electrodes 109 to the exterior thereof.

Figure 3A:
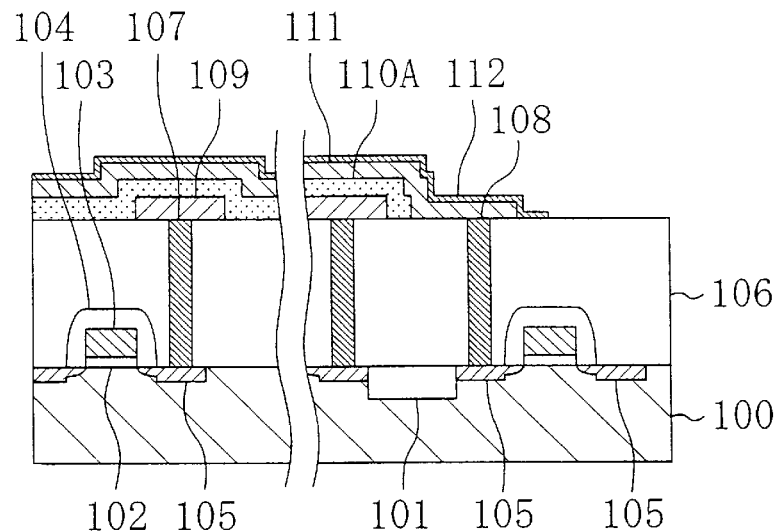
FIGS. 3(a) and (b) are cross-sectional views illustrating a method of fabricating the semiconductor device according to the first embodiment.

Next, a multilayer film consisting of a platinum film and a titanium film which are deposited in upwardly stacked relationship or a multilayer film consisting of a platinum film and a titanium nitride film which are deposited in upwardly stacked relationship is formed entirely over the capacitor insulating film 110A and the first protective film 106 and then patterned by dry etching, thereby forming the capacitor upper electrode 111 connected to the second contact plug 108, as shown in FIG. 3(a).

Next, a silicon nitride film or a boron nitride film is deposited entirely over the capacitor upper electrode 111 and the first protective insulating film 106 by CVD or sputtering and then patterned by dry etching, thereby forming the hydrogen barrier film 112 covering the capacitor.

Figure 3B:
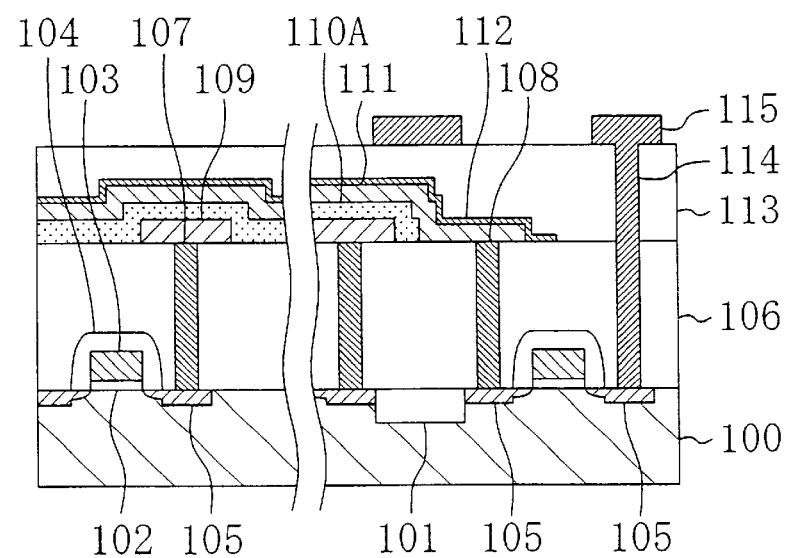

Next, as shown in FIG. 3(b), the second protective insulating film 113 is deposited entirely over the hydrogen barrier film 112 and the first protective insulating film 106. Then, a contact hole is formed in the second protective insulating film 113 and in the first protective insulating film 106. Thereafter, a multilayer film consisting of a titanium film, a titanium nitride film, an aluminum film, and a titanium nitride film which are deposited in upwardly stacked relationship or a multilayer film consisting of a titanium film, a titanium nitride film, a tungsten film, a titanium film, a titanium nitride film, an aluminum film, and a titanium nitride film which are deposited in upwardly stacked relationship is formed over the entire surface of the second protective insulating film 113 and then patterned, thereby forming the third contact plug 114 connected to the other of the impurity diffusion layers 105 which serves as the source or drain region of the second field-effect transistor and the wiring layer 115 connected to the third contact plug 114.

Figure 8:
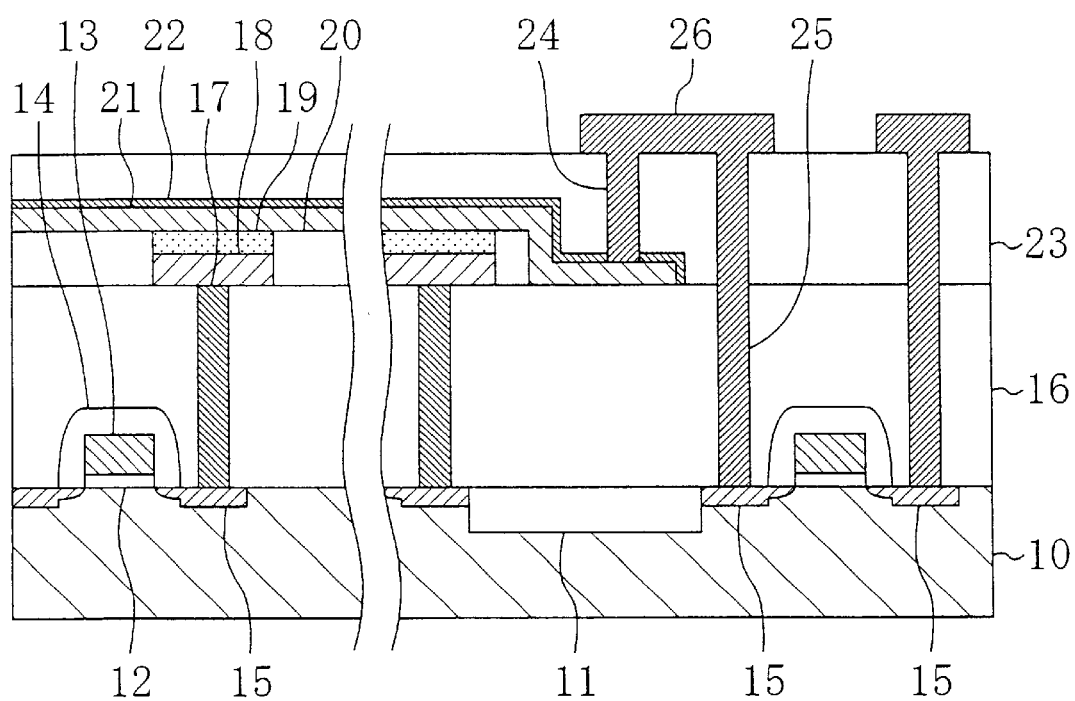
FIG. 8 is a cross-sectional view of a conventional semiconductor device.
Figure 9A:
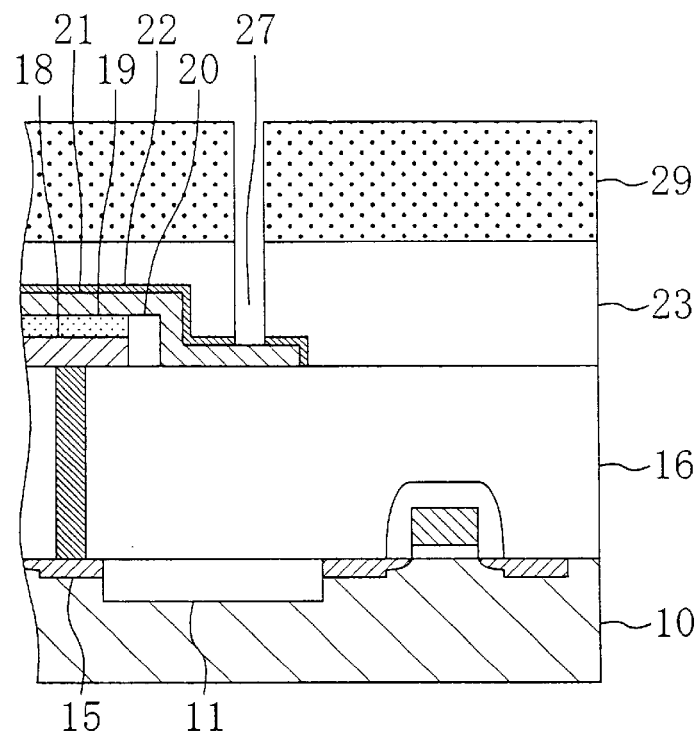
FIGS. 9(a) and (b) are cross-sectional views each illustrating a process step of a conventional method of fabricating a semiconductor device.
Figure 9B:
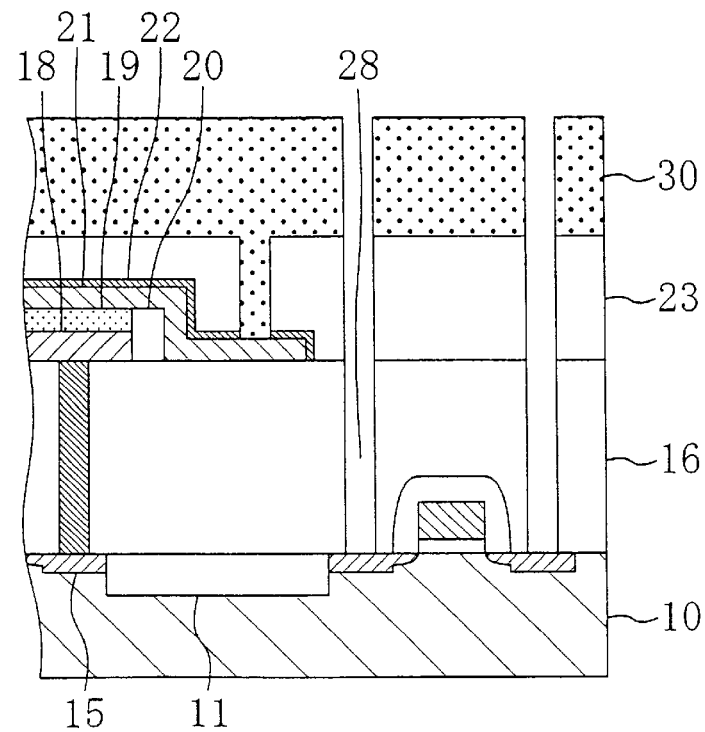
Figure 10A:
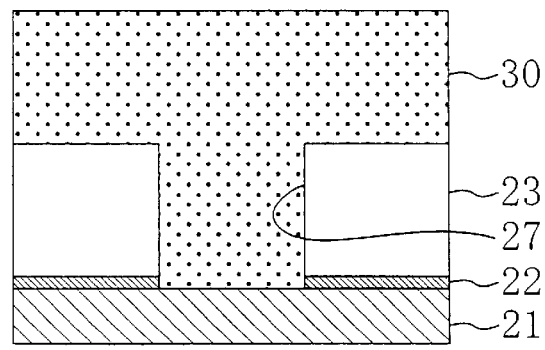
FIGS. 10(a) to (c) are cross-sectional views illustrating problems associated with the conventional semiconductor device and the fabrication method therefor.
Figure 10B:
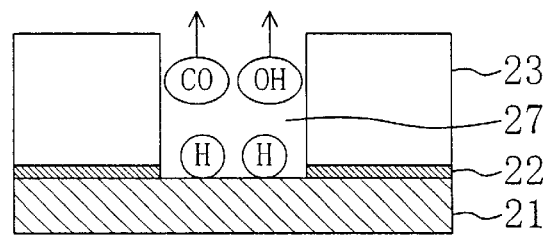
Figure 10C:
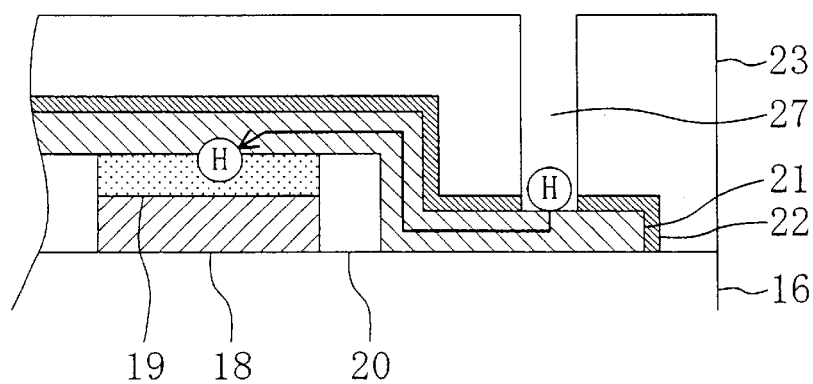
Figure 11:
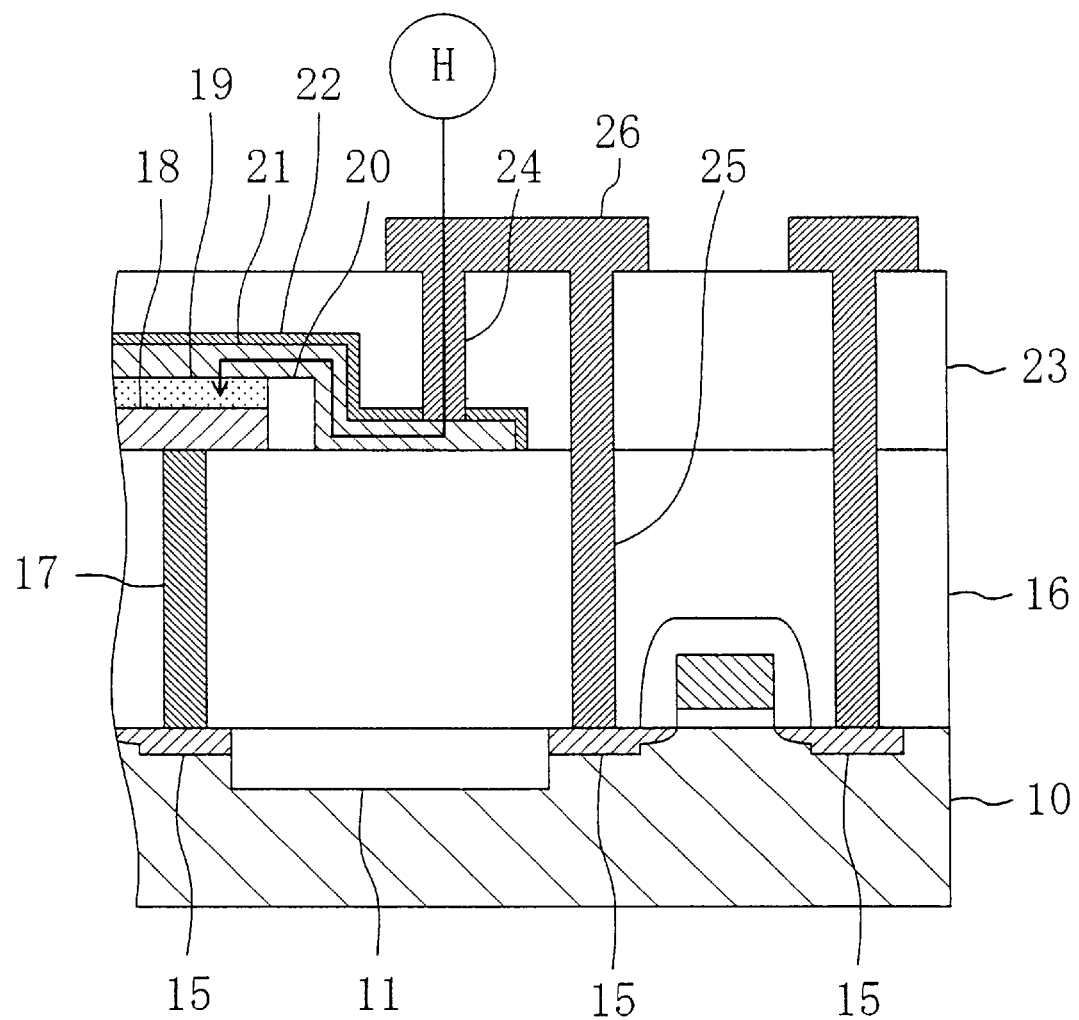
FIG. 11 is a cross-sectional views illustrating problems associated with the conventional semiconductor device and the fabrication method therefor.

In the semiconductor device according to the first embodiment and the fabrication method therefor, the capacitor upper electrode 111 of the capacitor for storing data which forms the memory cell is connected directly to the impurity diffusion layer 105 of the second field-effect transistor by the second contact plug 108 formed in the first protective insulating film 106. Unlike the conventional embodiment shown in FIG. 8, the capacitor upper electrode 111 is not connected to the impurity diffusion layer 105 via the second contact plug 24, the wiring layer 26, and the third contact plug 25. Since an opening is not formed in the hydrogen barrier film 112 covering the capacitor lower electrode 111, there can be circumvented a situation in which active hydrogen generated by the catalytic reaction of platinum is diffused in the capacitor upper electrode 111 to reach the capacitor insulating film 110A in the step of removing the resist pattern used to form the second or third contact plug 24 or 25 by using an oxygen plasma and a situation in which a hydrogen atom is diffused in the capacitor upper electrode 111 to reach the capacitor insulating film 110A in the step of performing an annealing process with respect to the wiring layer 115 formed on the second protective insulating film 113 in a hydrogen atmosphere. Accordingly, the insulating metal oxide composing the capacitor insulating film 110A is not reduced by hydrogen and the properties of the capacitor are improved.

Embodiment 2

A semiconductor device according to a second embodiment of the present invention will be described with reference to FIG. 4.

Figure 4:
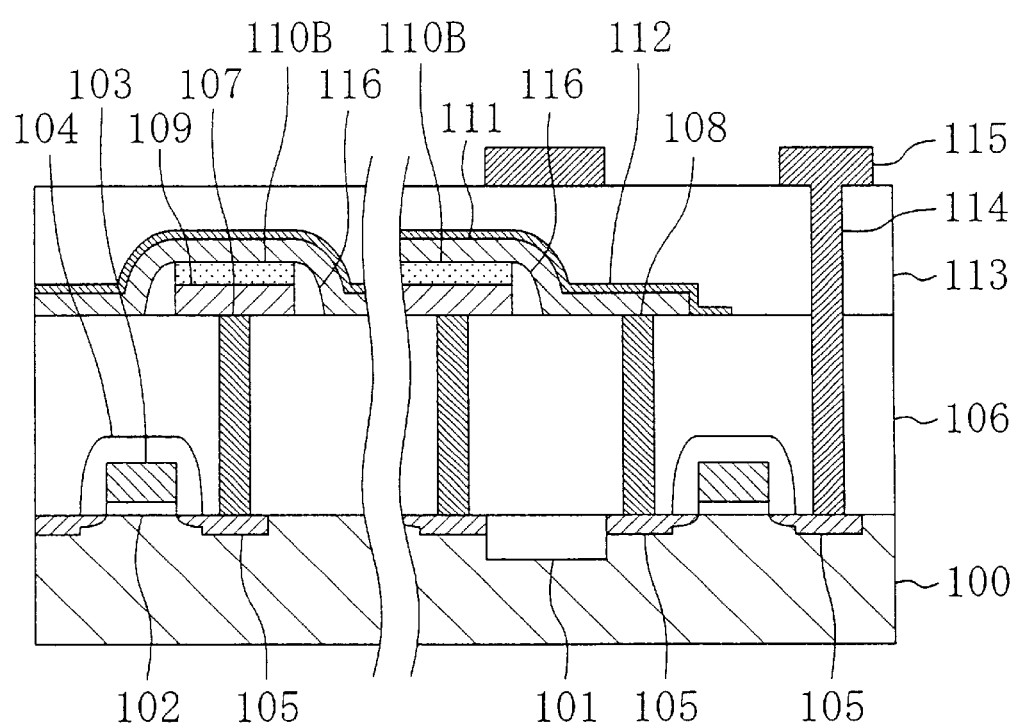
FIG. 4 is a cross-sectional view of a semiconductor device according to a second embodiment of the present invention.

As shown in FIG. 4, a device isolation region 101 and impurity diffusion layers 105 each serving as the source or drain region of a first field-effect transistor or as the source or drain region of a second field-effect transistor are formed in a surface portion of a semiconductor substrate 100, similarly to the first embodiment. A gate electrode 103 is formed on the semiconductor substrate 100 to be located between the pair of impurity diffusion layers 105. The top and side surfaces of the gate electrode 103 are covered with the gate protective insulating film 104.

Similarly to the first embodiment, a first protective insulating film 106 is deposited over the semiconductor substrate 100 and the gate protective insulating film 104. In the first protective insulating film 106, there are formed a first contact plug 107 and a second contact plug 108 each composed of a tungsten or polysilicon film. The first contact plug 107 is connected to one of the impurity diffusion layers 105 which serves as the source or drain region of the first field-effect transistor forming a memory cell. The second contact plug 108 is connected to one of the impurity diffusion layers 105 which serves as the source or drain region of the second field-effect transistor disposed in a peripheral portion of the memory cell to serve as a sense amp.

A capacitor lower electrode 109 composed of a multilayer film consisting of a titanium film, a titanium nitride film, an iridium oxide film, and a platinum film and connected to the first contact plug 107 is formed on the first protective insulating film 106. A capacitor insulating film 110B made of $SrBi_2(Ta_{1-x}Nb_x)O_9$ having a bismuth layered perovskite structure and conformal to the capacitor lower electrode 109 is formed on the capacitor lower electrode 109. The capacitor lower electrode 109 and the capacitor insulating film 110B have respective side surfaces covered with sidewalls 116 composed of a silicon oxide film.

A capacitor upper electrode 111 composed of a multilayer film consisting of a platinum film and a titanium film or a titanium nitride film is formed over the plurality of capacitor lower electrodes 109 and the capacitor insulating film 110B to extend to the exterior thereof and connected to the second contact plug 108. The capacitor upper electrode 111 is covered with a hydrogen barrier film 112 composed of a silicon nitride film or a boron nitride film.

The foregoing capacitor lower electrode 109, the capacitor insulating film 110B, and the capacitor upper electrode 111 constitute a capacitor for storing data. The capacitor and the first field-effect transistor constitute a memory cell. A plurality of memory cells constitute a memory array.

Similarly to the first embodiment, a second protective insulating film 113 is deposited on the first protective insulating film 106. A third contact plug 114 connected to the other of the impurity diffusion layers 105 which serves as the source or drain region of the second field-effect transistor is formed in the first and second protective insulating films 106 and 113. A wiring layer 115 connected to the third contact plug 114 is formed on the second protective insulating film 113. Each of the third contact plug 114 and the wiring layer 115 is composed of a multilayer film consisting of a titanium film, a titanium nitride film, an aluminum film, and a titanium nitride film which are deposited in upwardly stacked relationship or a multilayer film consisting of a titanium film, a titanium nitride film, a tungsten film, a titanium film, a titanium nitride film, an aluminum film, and a titanium nitride film which are deposited in upwardly stacked relationship.

Figure 5A:
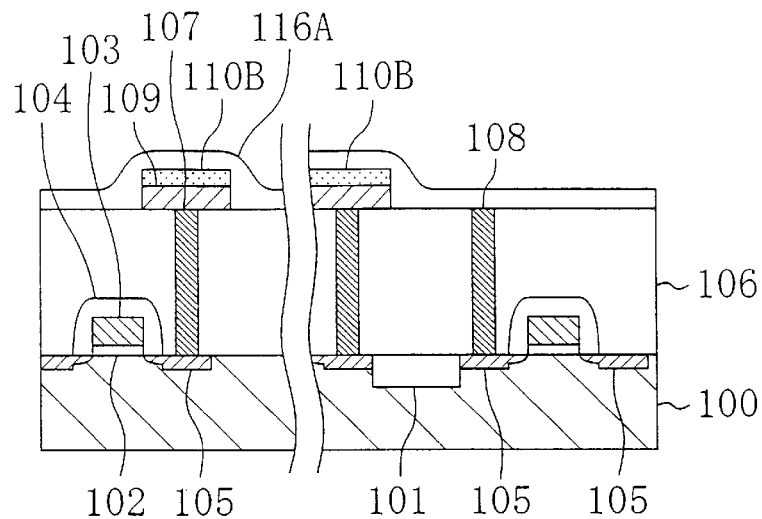
FIGS. 5(a) and (b) are cross-sectional views illustrating a method of fabricating the semiconductor device according to the second embodiment.

Referring to FIGS. 5(a) and (b), a description will be given to a method of fabricating a semiconductor device according to the second embodiment.

First, as shown in FIG. 5(a), the device isolation region 101 is formed in the surface portion of the semiconductor substrate 100, followed by the gate electrode 103 formed on the semiconductor substrate 100 with the gate insulating film 102 interposed therebetween and the gate protective insulating film 104 formed over the gate electrode 103. Thereafter, the impurity diffusion layers 105 each serving as the source or drain region of the first field-effect transistor or as the source or drain region of the second field-effect transistor and having an LDD structure are formed. Then, the first protective insulating film 106 is deposited over the entire surface of the semiconductor substrate 100. After that, the first contact plug 107 connected to one of the impurity diffusion layers 105 which serves as the source or drain region of the first field-effect transistor forming the memory cell is formed in the first protective insulating film, while the second contact plug 108 connected to one of the impurity diffusion layers 105 which serves as the source or drain region of the second field-effect transistor forming the sense amp is formed in the first protective insulating film 106.

Next, a multilayer film consisting of a titanium film, a titanium nitride film, an iridium oxide film, and a platinum film which are deposited in upwardly stacked relationship is formed by sputtering over the entire surface of the first protective insulating film 106. Then, a ferroelectric film made of $SrBi_2(Ta_{1-x}Nb_x)O_9$ having a bismuth layered perovskite structure and having a thickness of 100 nm to 200 nm is deposited on the multilayer film by metal organic decomposition, metal organic chemical vapor deposition, or sputtering. Thereafter, the multilayer film and the ferroelectric film are patterned by dry etching to form the capacitor lower electrode 109 composed of the multilayer film and the capacitor insulating film 110B composed of the ferroelectric film.

Figure 5B:
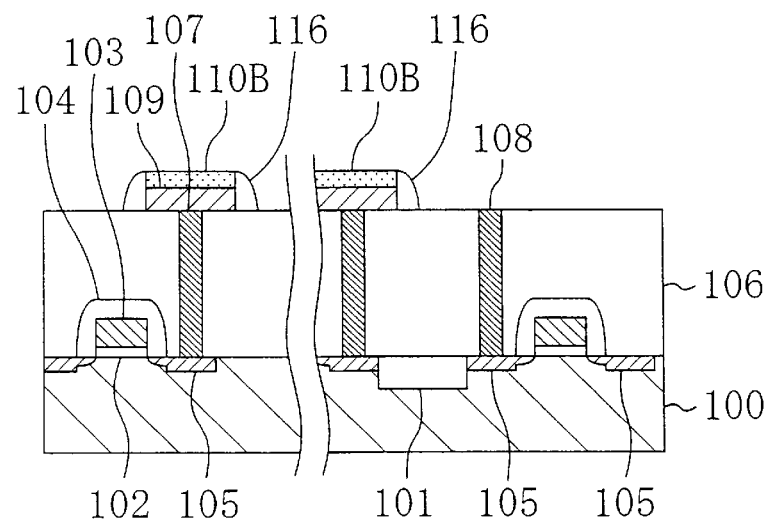

Next, the silicon oxide film 108 having a thickness of 300 nm is deposited entirely over the capacitor lower electrode 109 and the capacitor insulating film 110B and subjected to anisotropic etching, thereby forming the sidewalls 116 on the respective side surfaces of the capacitor lower electrode 109 and the capacitor insulating film 110B, as shown in FIG. 5(b).

Next, a multilayer film consisting of a platinum film and a titanium film which are deposited in upwardly stacked relationship or a multilayer film consisting of a platinum film and a titanium nitride film which are deposited in upwardly stacked relationship is deposited over the capacitor insulating film and the first protective film 106, similarly to the first embodiment. Thereafter, the multilayer film is patterned by dry etching, thereby forming the capacitor upper electrode 111 (see FIG. 4) connected to the second contact plug 108 and then forming the hydrogen barrier film 112 (see FIG. 4) covering the capacitor upper electrode 111.

Next, the second protective insulating film 113 is deposited over the hydrogen barrier film 112 and the first protective insulating film 106. Thereafter, the third contact plug 114 (see FIG. 4) connected to the other of the impurity diffusion layers 105 which serves as the source or drain region of the second field-effect transistor is formed in the first and second protective insulating films 106 and 113, while the wiring layer 115 (see FIG. 4) connected to the third contact plug 114 is formed on the second protective insulating film 113.

In the semiconductor device according to the second embodiment and the fabrication method therefor, the capacitor upper electrode 111 of the capacitor for storing data which forms the memory cell is connected directly to the impurity diffusion layer 105 of the second field-effect transistor by the second contact plug 108 formed in the first protective insulating film 106. Since an opening is not formed in the hydrogen barrier film 112 covering the capacitor lower electrode 111, there can be circumvented a situation in which active hydrogen generated by the catalytic reaction of platinum and a hydrogen atom in a hydrogen atmosphere in which the wiring layer 115 is annealed are diffused in the capacitor upper electrode 111 to reach the capacitor insulating film 110A. Accordingly, the capacitor insulating film 110A is not reduced by hydrogen and the properties of the capacitor are improved.

In particular, the second embodiment has deposited the ferroelectric film serving as the capacitor insulating film 110B on the multilayer film serving as the capacitor lower electrode 109, i.e., the second embodiment has deposited the ferroelectric film on the flat multilayer film. This allows easy formation of the ferroelectric film.

Moreover, since the multilayer film serving as the capacitor upper electrode 111 is deposited after the sidewalls 116 are formed on the respective side surfaces of the capacitor lower electrode 109 and the capacitor insulating film 110B, there is no conduction between the capacitor lower electrodes 109.

Embodiment 3

Figure 6:
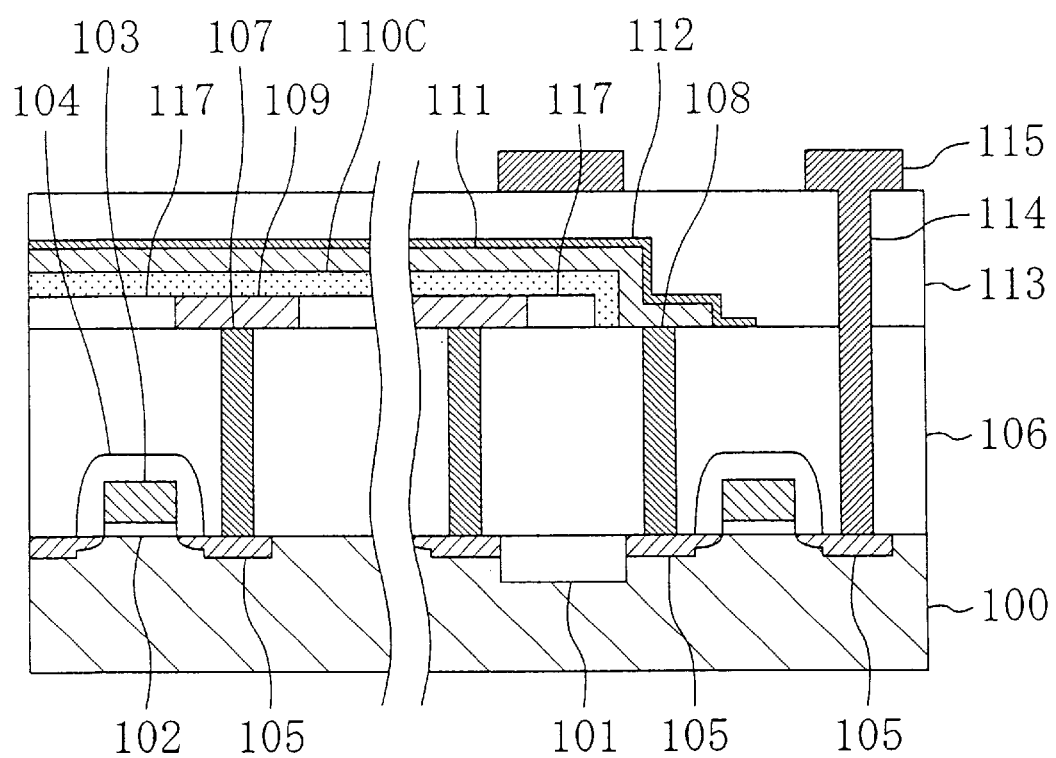
FIG. 6 is a cross-sectional view of a semiconductor device according to a third embodiment of the present invention.

As shown in FIG. 6, a device isolation region 101 and impurity diffusion layers 105 each serving as the source or drain region of a first field-effect transistor or as the source or drain region of a second field-effect transistor are formed in a surface portion of a semiconductor substrate 100, similarly to the first embodiment. A gate electrode 103 is formed on the semiconductor substrate 100 to be located between the pair of impurity diffusion layers 105. The top and side surfaces of the gate electrode 103 are covered with the gate protective insulating film 104.

Similarly to the first embodiment, a first protective insulating film 106 is deposited over the semiconductor substrate 100 and the gate protective insulating film 104. In the first protective insulating film 106, there are formed a first contact plug 107 and a second contact plug 108 each composed of a tungsten or polysilicon film. The first contact plug 107 is connected to one of the impurity diffusion layers 105 which serves as the source or drain region of the first field-effect transistor forming a memory cell. The second contact plug 108 is connected to one of the impurity diffusion layers 105 which serves as the source or drain region of the second field-effect transistor disposed in a peripheral portion of the memory cell to serve as a sense amp.

A capacitor lower electrode 109 composed of a multilayer film consisting of a titanium film, a titanium nitride film, an iridium oxide film, and a platinum film and connected to the first contact plug 107 is formed on the first protective insulating film 106. An insulating film 117 composed of a silicon oxide film is formed on the first protective insulating film 106 to be located between the capacitor lower electrodes 109.

A capacitor insulating film 110C made of $SrBi_2(Ta_{1-x}Nb_x)O_9$ having a bismuth layered perovskite structure is formed over the plurality of capacitor lower electrodes 109 and the insulating film 117 to extend to the exterior thereof.

A capacitor upper electrode 111 composed of a multilayer film consisting of a platinum film and a titanium film or a titanium nitride film and connected to the second contact plug 108 is formed on the capacitor insulating film 110C to extend to the exterior thereof. The capacitor upper electrode 111 is covered with a hydrogen barrier film 112 composed of a silicon nitride film or a boron nitride film.

The foregoing capacitor lower electrode 109, the capacitor insulating film 110C, and the capacitor upper electrode 111 constitute a capacitor for storing data. The capacitor and the first field-effect transistor constitute a memory cell. A plurality of memory cells constitute a memory array.

Similarly to the first embodiment, a second protective insulating film 113 is deposited on the first protective insulating film 106. A third contact plug 114 connected to the other of the impurity diffusion layers 105 which serves as the source or drain region of the second field-effect transistor is formed in the first and second protective insulating films 106 and 113. A wiring layer 115 connected to the third contact plug 114 is formed on the second protective insulating film 113. Each of the third contact plug 114 and the wiring layer 115 is composed of a multilayer film consisting of a titanium film, a titanium nitride film, an aluminum film, and a titanium nitride film which are deposited in upwardly stacked relationship or a multilayer film consisting of a titanium film, a titanium nitride film, a tungsten film, a titanium film, a titanium nitride film, an aluminum film, and a titanium nitride film which are deposited in upwardly stacked relationship.

Figure 7A:
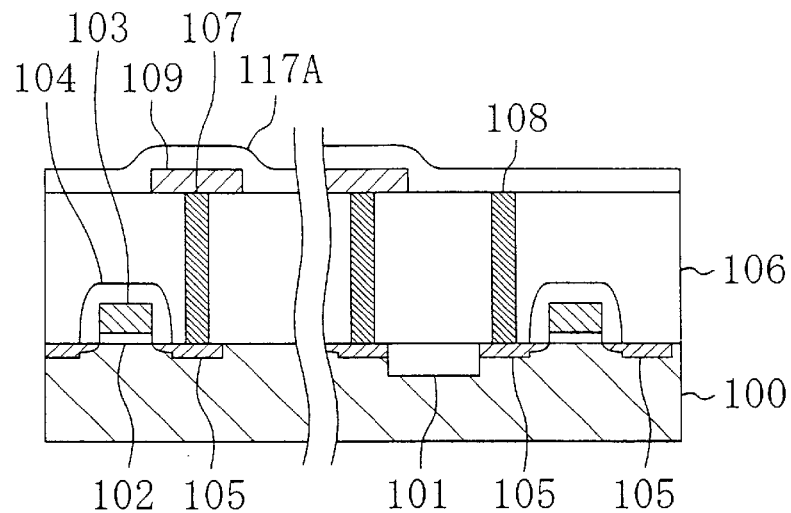
FIGS. 7(a) and (b) are cross-sectional views illustrating a method of fabricating the semiconductor device according to the third embodiment.

Referring to FIGS. 7(a) and (b), a description will be given to a method of fabricating a semiconductor device according to the third embodiment.

First, as shown in FIG. 7(a), the device isolation region 101 is formed in the surface portion of the semiconductor substrate 100, followed by the gate electrode 103 formed on the semiconductor substrate 100 with the gate insulating film 102 interposed therebetween and the gate protective insulating film 104 formed over the gate electrode 103. Thereafter, the impurity diffusion layers 105 each serving as the source or drain region of the first field-effect transistor or as the source or drain region of the second field-effect transistor and having an LDD structure are formed. Then, the first protective insulating film 106 is deposited over the entire surface of the semiconductor substrate 100. After that, the first contact plug 107 connected to one of the impurity diffusion layers 105 which serves as the source or drain region of the first field-effect transistor forming the memory cell is formed in the first protective insulating film, while the second contact plug 108 connected to one of the impurity diffusion layers 105 which serves as the source or drain region of the second field-effect transistor forming the sense amp is formed in the first protective insulating film 106.

Next, a multilayer film consisting of a titanium film, a titanium nitride film, an iridium oxide film, and a platinum film which are deposited in upwardly stacked relationship is formed by sputtering over the entire surface of the first protective insulating film 106. The multilayer film is then patterned by dry etching, thereby forming the capacitor lower electrode 109.

Figure 7B:
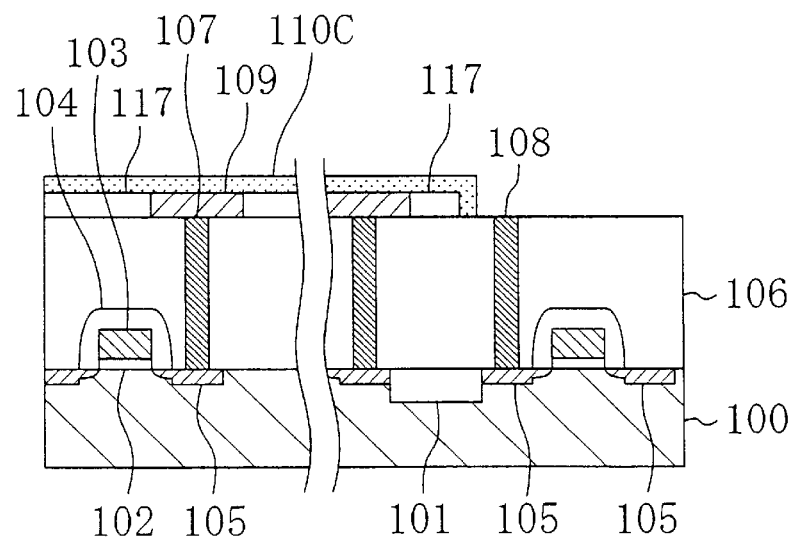

Next, a silicon oxide film 117A having a thickness of 300 nm is deposited over the entire surface of the capacitor lower electrode 109. Subsequently, the portion of the silicon oxide film 117A overlying the capacitor lower electrode 109 is removed by CMP, whereby the insulating film 117 composed of the silicon oxide film 117A is formed on the first protective insulating film 106 to be located between the capacitor lower electrodes 109, as shown in FIG. 7(b).

Next, a ferroelectric film made of $SrBi_2(Ta_{1-x}Nb_x)O_9$ having a bismuth layered perovskite structure and having a thickness of 100 nm to 200 nm is deposited over the plurality of capacitor lower electrodes 109 and the insulating film 117 by metal organic decomposition, metal organic chemical vapor deposition, or sputtering. The ferroelectric film is then patterned by dry etching to form the capacitor insulating film 110 extending over the plurality of capacitor lower electrodes 109 to the exterior thereof.

Next, a multilayer film consisting of a platinum film and a titanium film which are deposited in upwardly stacked relationship or a multilayer film consisting of a platinum film and a titanium nitride film which are deposited in upwardly stacked relationship is deposited over the capacitor insulating film and the first protective film 106, similarly to the first embodiment. Thereafter, the multilayer film is patterned by dry etching, thereby forming the capacitor upper electrode 111 (see FIG. 6) connected to the second contact plug 108 and then forming the hydrogen barrier film 112 (see FIG. 6) covering the capacitor upper electrode 111.

Next, the second protective insulating film 113 is deposited over the hydrogen barrier film 112 and the first protective insulating film 106. Thereafter, the third contact plug 114 (see FIG. 6) connected to the other of the impurity diffusion layers 105 which serves as the source or drain region of the second field-effect transistor is formed in the first and second protective insulating films 106 and 113, while the wiring layer 115 (see FIG. 6) connected to the third contact plug 114 is formed on the second protective insulating film 113.

In the semiconductor device according to the third embodiment and the fabrication method therefor, the capacitor upper electrode 111 of the capacitor for storing data which forms the memory cell is connected directly to the impurity diffusion layer 105 of the second field-effect transistor by the second contact plug 108 formed in the first protective insulating film 106. Since an opening is not formed in the hydrogen barrier film 112 covering the capacitor lower electrode 111, there can be circumvented a situation in which active hydrogen generated by the catalytic reaction of platinum and a hydrogen atom in a hydrogen atmosphere in which the wiring layer 115 is annealed are diffused in the capacitor upper electrode 111 to reach the capacitor insulating film 110A. Accordingly, the capacitor insulating film 110A is not reduced by hydrogen and the properties of the capacitor are improved.

In particular, the third embodiment has deposited the ferroelectric film serving as the capacitor insulating film 110C over the plurality of capacitor lower electrodes 109 and the insulating film 117 having their surfaces planarized. This allows easy formation of the ferroelectric film.

Although the capacitor insulating films 110A, 110B, and 110C according to the first to third embodiments have been formed of $SrBi_2(Ta_{1-x}Nb_x)O_9$, each of the capacitor insulating films 110A, 110B, and 110C may also be formed of a ferroelectric film having a bismuth layered perovskite structure having another composition or of a high-dielectric-constant film such as lead zirconate titanate, barium strontium titanate, or tantalum pentaoxide.

Although the capacitor upper electrode 111 according to each of the first to third embodiments has been formed of the multilayer film consisting of the platinum film and the titanium film which are deposited in upwardly stacked relationship or of the multilayer film consisting of the platinum film and the titanium nitride film which are deposited in upwardly stacked relationship, it is not limited thereto. The capacitor upper electrode 111 may be formed appropriately so long as it contains a platinum film, an iridium film, a ruthenium film, a rhodium film, or a multilayer film consisting of some of the films listed above.

Although the capacitor lower electrode 109 according to each of the first to third embodiments has been formed of the multilayer film consisting of the titanium film, the titanium nitride film, the iridium oxide film, and the platinum film which are deposited in upwardly stacked relationship, it is not limited thereto. The capacitor lower electrode 109 may be formed appropriately so long as it contains a platinum film, an iridium film, a ruthenium film, a rhodium film, or a multilayer film consisting of some of the films listed above.

What is claimed is:

1. A method of fabricating a semiconductor device, the method comprising the steps of:

depositing a protective insulating film on a semiconductor substrate having first and second field-effect transistors formed thereon;

forming a first contact plug and a second contact plug in the protective insulating film, the first contact plug being connected to an impurity diffusion layer serving as a source or drain region of the first field-effect transistor, the second contact plug being connected to an impurity diffusion layer serving as a source or drain region of the second field-effect transistor;

forming, on the protective insulating film, a capacitor lower electrode connected directly to the first contact plug;

forming, on the capacitor lower electrode, a capacitor insulating film made of an insulating metal oxide; and forming, on the capacitor insulating film, a capacitor upper electrode connected to the second contact plug.

2. The method of claim 1, further comprising the step of:

forming a hydrogen barrier film covering the capacitor upper electrode.

3. The method of claim 1, wherein the step of forming the capacitor insulating film includes the step of forming a capacitor insulating film which is conformal to the capacitor lower electrode, the method further comprising, between the step of forming the capacitor insulating film and the step of forming the capacitor upper electrode, the step of:

forming insulating sidewalls on respective side surfaces of the capacitor lower electrode and the capacitor insulating film, the step of forming the capacitor upper electrode includes the step of forming the capacitor upper electrode over the capacitor insulating film and the sidewalls.

4. The method of claim 1, wherein the step of forming the capacitor lower electrodes includes the step of forming a plurality of capacitor lower electrodes on the protective insulating film, the method further comprising, between the step of forming the capacitor lower electrode and the step of forming the capacitor insulating film, the step of:

forming an insulating film between the plurality of capacitor lower electrodes, wherein the step of forming the capacitor insulating film includes the step of forming the capacitor insulating film over the plurality of capacitor lower electrodes and the insulating film.

5. The method of claim 1, wherein the capacitor upper electrode is directly connected to the second contact plug.

* * * * *